(12) United States Patent
Philippot et al.

(10) Patent No.: US 9,281,103 B2
(45) Date of Patent: Mar. 8, 2016

(54) POLYMER LOCALLY COMPRISING CONDUCTIVE AREAS

(75) Inventors: Gilles Philippot, Saint Jean de Cuculles (FR); Philippe Coronel, Barraux (FR); Jacqueline Bablet, Le Gua (FR); Mohamed Benwadih, Champigny-sur-Marne (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 293 days.

(21) Appl. No.: 13/990,164

(22) PCT Filed: Dec. 5, 2011

(86) PCT No.: PCT/FR2011/000636
§ 371 (c)(1),
(2), (4) Date: May 29, 2013

(87) PCT Pub. No.: WO2012/072900
PCT Pub. Date: Jun. 7, 2012

(65) Prior Publication Data
US 2013/0256937 A1  Oct. 3, 2013

(30) Foreign Application Priority Data
Dec. 3, 2010 (FR) .................................. 10 04717

(51) Int. Cl.
*B29C 59/00* (2006.01)
*H01B 13/00* (2006.01)
(Continued)

(52) U.S. Cl.
CPC ............ *H01B 13/00* (2013.01); *H01L 51/0023* (2013.01); *H01L 51/102* (2013.01)

(58) Field of Classification Search
CPC ...................................................... B29C 70/882
USPC .................................................. 264/104, 293
See application file for complete search history.

(56) References Cited

U.S. PATENT DOCUMENTS 3,248,474 A    4/1966  Weed
4,588,456 A *  5/1986  Dery et al. .................... 156/52
(Continued)

FOREIGN PATENT DOCUMENTS

CN    101426875 A    5/2009
EP    2 011 844 A1   1/2009
(Continued)

OTHER PUBLICATIONS

Mar. 20, 2012 International Search Report issued in International Application No. PCT/FR2011/000636.
(Continued)

*Primary Examiner* — Christina Johnson
*Assistant Examiner* — Xue Liu
(74) *Attorney, Agent, or Firm* — Oliff PLC

(57) ABSTRACT

A method for producing a conductive area in a polymer material comprises: providing a polymer layer comprising conductive particles with a density such that the polymer layer is insulating, heating the polymer material to a temperature higher than or equal to the glass transition temperature of the polymer material, compressing a portion of the polymer layer using a stamp, in order to obtain a density of conductive particles such that the portion becomes conductive, and removing the stamp from the polymer layer.

13 Claims, 4 Drawing Sheets

(51) Int. Cl.
*H01L 51/00* (2006.01)
*H01L 51/10* (2006.01)

(56) References Cited

U.S. PATENT DOCUMENTS 7,279,418 B2 * 10/2007 Bechevet et al. .............. 438/666
2004/0075155 A1 4/2004 Huang et al.
2010/0155964 A1 6/2010 Katsurayama et al.

FOREIGN PATENT DOCUMENTS

EP          2 284 236  A1    2/2011
JP          2004-314238 A    11/2004
JP          2008-288239 A    11/2008
JP          2010-024416 A    2/2010
WO     WO 2004/055920 A2    7/2004
WO     WO 2009/128514 A1    10/2009

OTHER PUBLICATIONS

May 11, 2015 Office Action issued in Chinese Patent Application No. 201180066309.5.

May 19, 2015 Office Action issued in Japanese Patent Application No. 2013-541398.

* cited by examiner

POLYMER LOCALLY COMPRISING CONDUCTIVE AREAS

BACKGROUND OF THE INVENTION

The invention relates to the formation of devices in a layer of polymer material, and more particularly to creation of conductive areas in the polymer material.

STATE OF THE ART

In the field of organic electronics, devices are generally formed from polymer materials. Although polymers are for the most part insulating, there are some polymers, called conjugated polymers, that conduct electricity in the doped state. In a non-doped state, the conjugated polymers are semi-conducting materials. They are then used as active layer in devices such as organic light-emitting diodes (OLED), organic field effect transistors (OFET) or organic photovoltaic cells.

Thermoplastic polymer materials are generally classified in two categories, amorphous and semicrystalline. An amorphous polymer presents a disordered structure, i.e. the molecular chains of the polymer are interleaved. In a semicrystalline polymer, the chains are locally ordered to form single crystals. These single crystals are coated with amorphous material. Semicrystalline polymers are thus characterized by their crystallinity ratio.

The glass transition temperature $T_G$ is defined as being the temperature at which an amorphous thermoplastic material goes from a solid state to a rubbery state. Below the temperature $T_G$, the material is in solid, or glassy, state and presents an elastic behaviour. Above $T_G$, the bonds between the molecular chains become fragile. The material softens and can be plastically deformed.

The glass transition phenomenon also applies to a semicrystalline thermoplastic material as it is partly composed of amorphous material. A semicrystalline material is further characterized by a melting temperature $T_M$, which is higher than $T_G$. Above the melting temperature, the material becomes completely amorphous. Semicrystalline materials are therefore generally heated to a temperature comprised between $T_G$ and $T_M$ to preserve their crystalline nature.

FIGS. 1 to 3 represent steps of a method for producing an organic Thin-Film Transistor (TFT) according to Patent application US2004/0075155.

FIG. 1 represents a substrate 2 made from thermoplastic polymer material covered by a track 4 made from electrically conductive material. A metal tool 6, provided with a stamp 8, is heated to a higher temperature than the glass transition temperature of thermoplastic material 2. Material 2 is also heated.

In FIG. 2, tool 6 is pressed against substrate 2 at the level of track 4. The stamp 8 penetrates into substrate 2, which deforms the thermoplastic material and cuts conductive track 4. Track 4 is divided into two parts, 10a and 10b corresponding to the drain and source of the transistor. A fragment 12 of track 4 is pushed in substrate 2 by stamp 8.

Material 2 is then cooled under pressure to compensate removal of material 2 and thereby maintain the dimensions of the deformed portion.

FIG. 3 represents a step for completing the transistor, after tool 6 has been removed from substrate 2. A layer 14 of semiconducting polymer material is deposited on conductive track 4, above drain 10a and source 10b, and in the trench remaining above fragment 12, forming a channel between the drain and source. A gate oxide 16 and a gate 18 are then deposited on layer 14 above the channel.

FIG. 4 represents an example of a conductive track 4 cut according to the technique of document US2004/0075155. In certain cases, cutting of track 4 is poorly aligned with respect to the embossed portion of material 2, as represented in FIG. 4. It is in fact difficult to control how track 4 is cut. Track 4 may even not be cut and flow following the contour of the stamp.

This technique therefore does not enable a conductive layer to be cut in clean and symmetric manner to define the drain and source of an organic transistor. Such an imprecision is detrimental to operation of the transistor.

SUMMARY OF THE INVENTION

A need therefore exists to provide a method that is precise and easy to implement to fabricate a device comprising electrically conductive areas of controlled dimensions on a layer of electrically insulating polymer material.

This need tends to be satisfied by providing a polymer layer comprising conductive particles with a density such that the layer is insulating, heating the polymer material to a temperature higher than or equal to the glass transition temperature of the polymer material, compressing a portion of the polymer layer by means of a stamp, in order to obtain a density of conductive particles such that the portion becomes conductive, and removing the stamp from the polymer layer.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

By observing the behaviour of a polymer material when it is heated and compressed with a mould, it appears that a part of the material, located under the salient parts of the mould, is compressed. The remaining part of the material flows towards the recesses of the mould.

It is proposed here to put this observation into application to form a device provided with electrically conductive areas. For this, a polymer material layer with electrically conductive particles dispersed therein is used. Initially, the density of particles is such that the layer is insulating. By compressing certain areas of the polymer material, the particles are concentrated to make these areas conductive.

Figure 1:
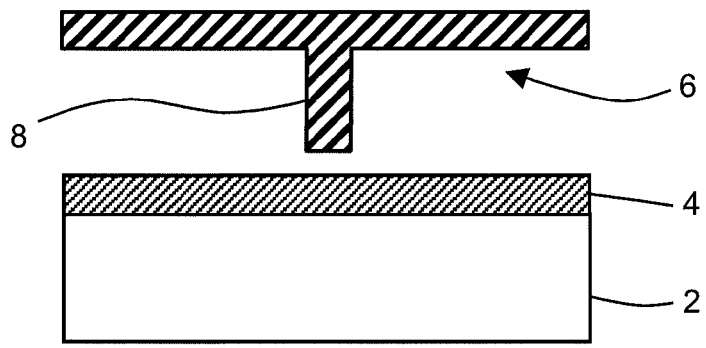
FIGS. 1 to 3, previously described, represent steps of a method for forming an organic transistor according to the prior art.
Figure 2:
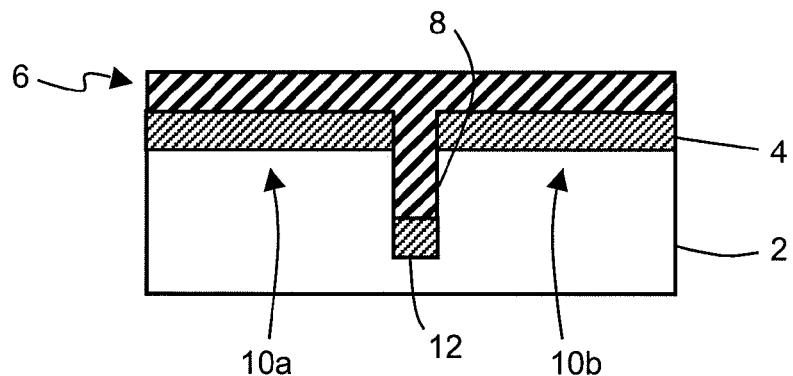
Figure 3:
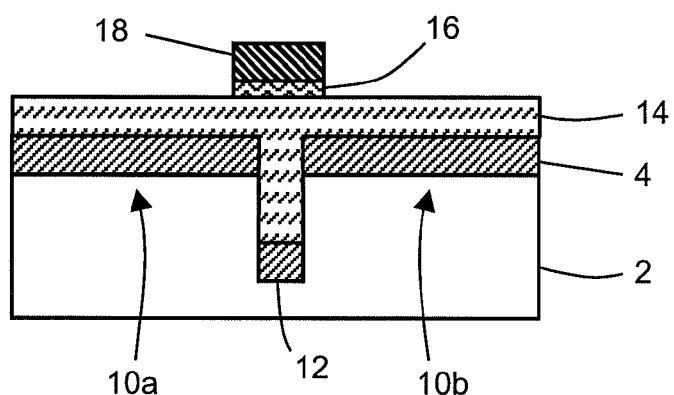
Figure 4:
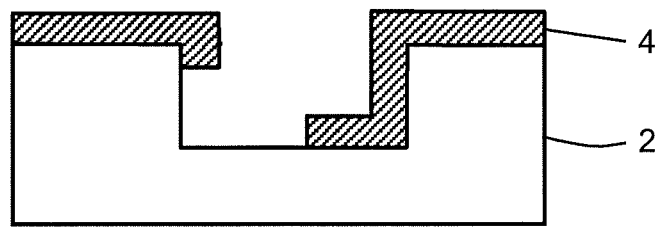
FIG. 4, previously described, represents an example of cutting of a conductive track on a plastic substrate according to the method of FIGS. 1 to 3.
Figure 5:
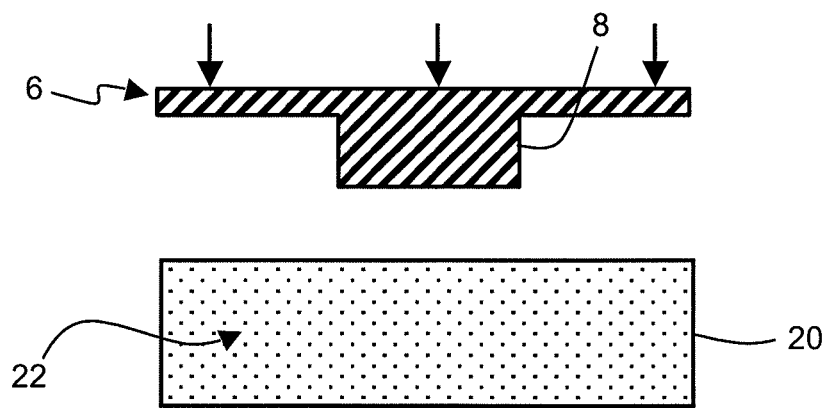
FIGS. 5 to 7 represent steps of a method for producing conductive areas in an insulating polymer material according to the invention.
Figure 6:
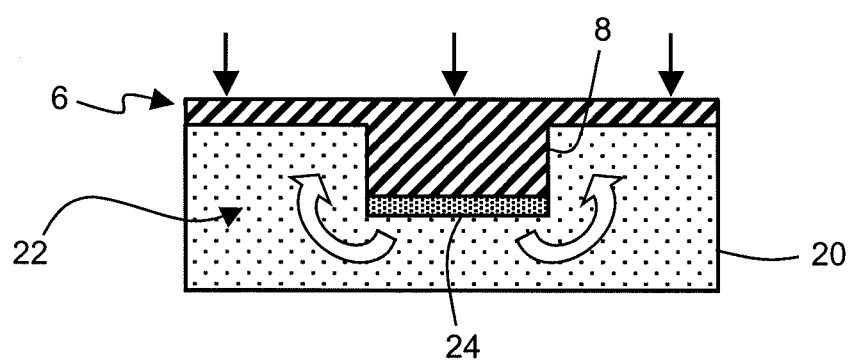

FIGS. 5 and 6 represent steps of a method for forming a device from a polymer material layer according to this principle.

FIG. 5 represents a layer 20 mainly comprising a polymer material, preferably a thermoplastic polymer. Layer 20 further comprises conductive particles 22 dispersed in the polymer material. The particles are preferably dispersed in globally homogeneous manner in layer 20. It could however be envisaged to provide areas charged with conductive particles, to be compressed, and areas devoid of particles.

Conductive particles 22 are preferably metal particles, for example made from nickel, copper or silver, metal and semiconductor-based mixtures such as silicides ($CoSi_2$, NiSi) or carbon particles (for example in graphene or fullerene form).

A mould 6 is arranged above layer 20. It comprises a stamp 8 defining a pattern and directed towards layer 20. Mould 6 is preferably formed from a heat conducting material, for example a metal or silicon, and heated to a temperature higher than or equal to the glass transition temperature of polymer material 20.

In FIG. 6, mould 6 is pressed against layer 20. Stamp 8 penetrates into layer 20 and deforms the polymer material charged with particles. This deformation is made possible by heating of material 20, either directly or via mould 6. This results in a localized compressed area 24 underneath stamp 8.

In other words, the complementary part of the pattern formed in the mould is printed on layer 20.

The compression step preferably has a duration comprised between 1 min and 60 min. The pressure applied is preferably comprised between 1 MPa and 3 MPa. When compression takes place, polymer material 20 reaches a temperature higher than or equal to the glass transition temperature $T_G$. The temperature reached is preferably lower than or equal to the melting temperature $T_M$ of the polymer. The temperature of material 20 is preferably 50° C. to 90° C. higher than the glass transition temperature $T_G$.

In the case of a thermoplastic material 20, the amorphous regions will flow due to the action of the temperature and of the pressure, as indicated in schematic manner by the block arrows in FIG. 6. Particles 22 are on the other hand concentrated in compressed area 24, which makes area 24 electrically conductive. The distance between the conductive particles in fact becomes sufficiently small for an electric current to be able to flow through the polymer material. The electric resistivity in area 24 then decreases significantly.

In the remaining area of layer 20, the density of particles doesn't substantially vary. The displacement of particles 22 with the amorphous material is in fact negligible. This area therefore remains electrically insulating. As a precautionary measure, the patterns can be separated from one another so that they are effectively separated by an insulating area.

Recessed area can further be provided in proximity to the area to be embossed. These recessed area will then be able to absorb the material repelled when compression takes place.

It is generally considered that a polymer material is insulating when its resistivity is higher than $10^4$ Ω·cm and that a material is conductive below 1 Ω·cm. The density of particles in area 24 is thus such that the resistivity is less than 1 Ω·cm and the density of particles in the remaining layer 20 is such that the resistivity is higher than $10^4$ Ω·cm.

In general manner, area 24 becomes conductive when the density of particles is higher than or equal to the percolation threshold. This threshold depends mainly on the materials used and on the size of the conductive particles, and can be expressed in percentage of the volume of particles in the polymer material. It is preferably comprised between 1% and 20%. It is for example equal to about 20% when the particles are distributed in homogeneous manner and about 1% when the particles have been previously organized, for example grouped together in planes parallel to the surface to be compressed.

Material 20 is preferably cooled maintaining the pressure of mould 6 to fix the dimensions of the pattern printed in layer 20.

Figure 7:
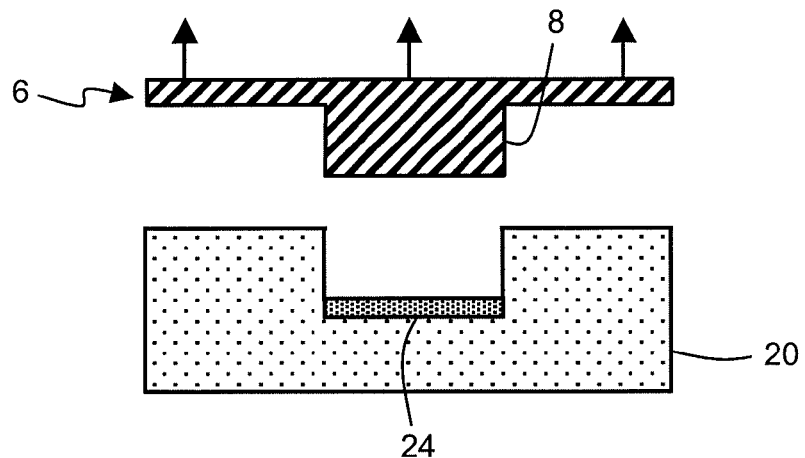

In the step of FIG. 7, mould 6 and its stamp 8 are removed from polymer layer 20. A device is then obtained provided with an electrically conductive area 24 sunk in the polymer layer.

The method can continue by the steps of filling of the embossed region, for example with an electrically insulating or semiconducting material, to finalize the device. Conductive area 24 is then buried.

This method thus enables formation of an electronic device such as a field effect transistor. In this case, conductive area 24 can act as gate electrode of the transistor. The subsequently deposited insulating layer and semiconductive layer will respectively form the gate oxide and the channel of the transistor.

For example purposes, a layer of polyethylene naphtalate (PEN), with a thickness of about 125 μm, is arranged on a silicon support substrate. Polyethylene naphtalate is a semi-crystalline thermoplastic material having a crystallinity ratio of about 45%. The ratio of amorphous material is therefore equal to 55%, which makes the PEN material compressible. The glass transition temperature of polyethylene naphtalate is about 120° C.

Nickel particles are inserted in the PEN layer. The quantity of particles represents about 5% of the volume of the thermoplastic material. The resistivity of the layer obtained is about equal to $10^6$ Ω·cm.

The mould comprises stamps in the form of dots of rectangular cross-section having a height of about 20 μm.

The substrate and mould are placed in a press equipped with two heating systems, one in contact with the mould and the other in contact with the support substrate. The substrate and mould are both heated to a temperature of about 190° C.

The mould is then applied on the polyethylene naphtalate layer for approximately 5 min, maintaining the temperature at 190° C. and exerting a pressure of about 1.2 MPa.

As described in the foregoing, the amorphous material of the compressed areas flows into the layer to fill the cavities of the mould (between the dots) whereas the single crystals and the conductive particles are concentrated in the compressed areas.

In the compressed areas, the quantity of nickel particles is close to 20% of the volume of PEN material. The resistivity is situated below 1 Ω·cm. The compressed areas have therefore become conductive.

Figure 8:
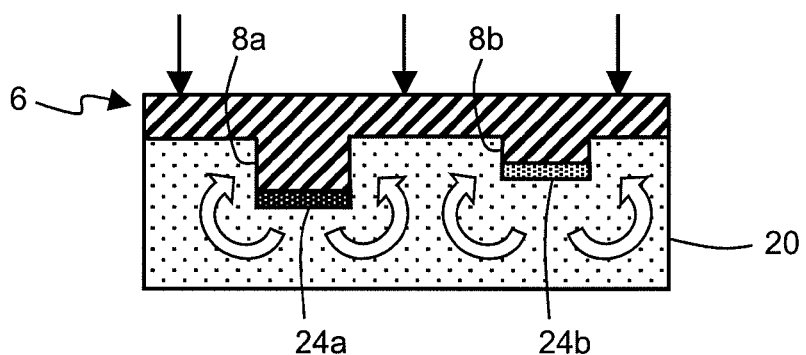
FIGS. 8 to 10 represent variants for implementing the compression step of FIG. 6.

FIG. 8 represents an alternative embodiment in which mould 6 comprises two stamps 8a and 8b. Stamps 8a and 8b have different depression heights in the polymer layer. Stamp 8a has for example a larger height than stamp 8b. When the mould is applied, two conductive areas 24a and 24b are obtained. Area 24a corresponding to stamp 8a has a higher electric conductivity than area 24b. By adjusting the heights of the stamps, areas on different levels and of different conductivities can thus be obtained.

Figure 9:
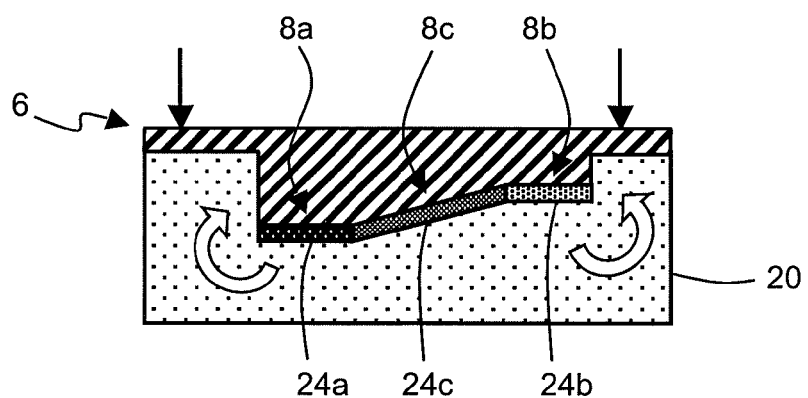

In the embodiment of FIG. 9, mould 6 comprises a stamp having a variable depression height. The stamp comprises for example two flat portions 8a and 8b having different depression heights (like the stamps of FIG. 8), and an intermediate portion 8c which joins portions 8a and 8b. Portion 8c preferably presents a depression height which varies continuously between the height of portion 8a and the height of portion 8b.

After stamping, two conductive areas 24a and 24b of different conductivities are obtained, electrically connected by a third conductive area 24c. Areas 24a and 24b are respectively obtained by compression of portions 8a and 8b of the stamp, as was described in relation with FIG. 8. Area 24c, which results from compression of portion 8c, presents an electric conductivity gradient due to the variable depression height of portion 8c.

In the example of FIG. 9, the electric conductivity gradient of area 24c extends in continuous manner from the conductivity of area 24a to the conductivity of area 24b.

Figure 10:
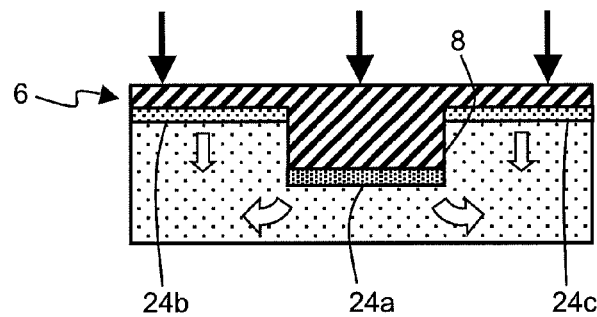

FIG. 10 represents another variant of the step of FIG. 6. By increasing the pressure, the top surface of layer 20 is also compressed. The displaced material is then distributed in the volume of layer 20. Gate 24a, drain 24b and source 24c of a transistor can for example be defined in this manner in a polymer layer.

In this case, it is the whole mould 6 that acts as stamp, i.e. that serves the purpose of compressing the polymer layer.

Figure 11A:
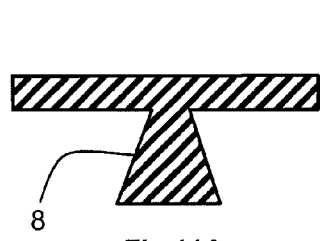
FIGS. 11A to 11C represent examples of a mould used in the method according to the invention.
Figure 11B:
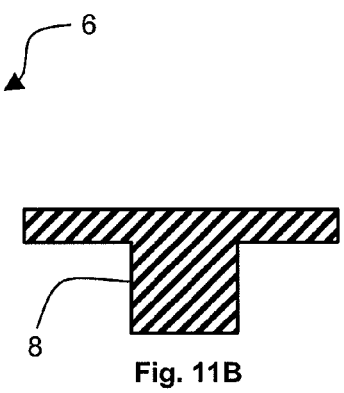
Figure 11C:
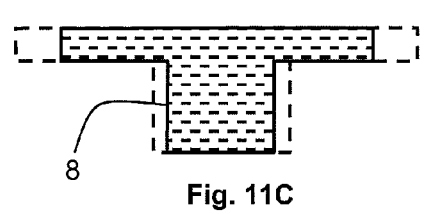

FIGS. 11A to 11C represent example embodiments of a mould 6. By choosing the configuration of the mould, the particle concentration phenomenon can be mastered. In the example of FIG. 11A where the stamp has a base narrower than its apex, the compressed area will be essentially situated underneath stamp 8. On the other hand, in the case of FIG. 11B where the stamp is of rectangular cross-section, a compressed area is also observed at the level of the lateral surfaces of stamp 8 (not represented in FIGS. 6 to 10).

A mould provided with a pattern having dimensions which vary when an electric current, an electric field, a magnetic field or another stimulation are applied, can also be envisaged (FIG. 11C). Such a mould is preferably formed from a piezoelectric, magnetostrictive, or electrostrictive material, a shape memory material or a material of electrolyte type. Depending on the nature and intensity of the stimulation, stamp 8 adopts a particular shape. For example, if stamp 8 deforms laterally, a conductive area will be obtained on the sides of the pattern printed in layer 20.

Figure 12:
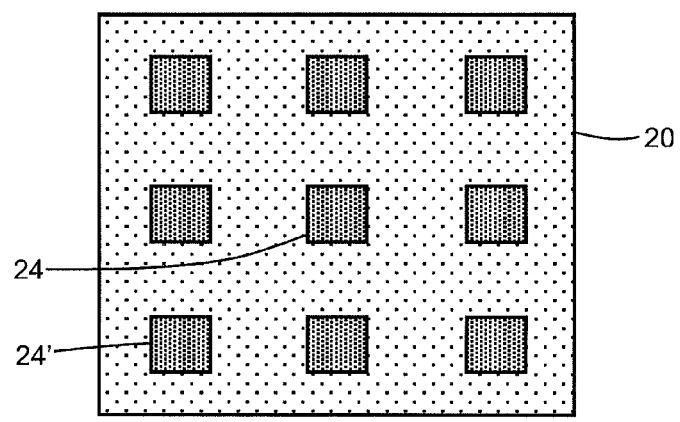
FIG. 12 represents an embodiment of a device comprising several conductive areas obtained by the method according to the invention.

FIG. 12 represents a top view of an embodiment of a device comprising several conductive areas 24, 24' in an insulating polymer layer 20. A conductive area, for example area 24 located in the centre of FIG. 12, can be eliminated by applying a high voltage or a magnetic field thereto. A temperature increase is thereby generated which locally softens material 20 and enables displacement of the particles. The thermal agitation disperses the conductive particles. Area 24 then becomes insulating.

Inversely, it is possible to make this central area 24 conductive again by applying an electric or magnetic field around area 24, for example by means of peripheral areas 24', and by heating central area 24. The mobile particles are again concentrated in the central area.

Thus, by preparing a plastic substrate charged with conductive particles and by compressing it, conductive zones are defined directly in the substrate in simple and precise manner. The need for a conductive layer deposited on the substrate and cutting of such a layer are thereby eliminated.

A large number of polymer materials can henceforth be used to form an electronic device provided with conductive areas. The choice is in fact no longer limited to conjugated polymers that are, usually doped to become conductive. In particular, elastomers can be used.

The method described above is simpler than conjugated polymer doping techniques, as it requires less technological steps. Furthermore, the doped areas are unchangeable whereas conductive areas 24 obtained by compression are configurable at will.

The invention claimed is:

1. A method for producing an electrically conductive area in a polymer material, comprising:
    providing a polymer layer comprising electrically conductive particles with a density such that the layer is insulating,
    heating the polymer material to a temperature higher than or equal to a glass transition temperature of the polymer material,
    compressing a portion of the polymer layer by means of a stamp, in order to obtain a density of conductive particles such that the portion becomes conductive, and such that the conductive portion is superimposed on a portion of the polymer layer that is insulating, and
    removing the stamp from the polymer layer.

2. The method according to claim 1, wherein the portion of the polymer layer is compressed during a time comprised between 1 min and 60 min.

3. The method according to claim 1, wherein the portion of the polymer layer is compressed with a pressure comprised between 1 MPa and 3 MPa.

4. The method according to claim 1, wherein the polymer layer is compressed by means of two stamps having different depression heights, resulting in two electrically conductive areas having different electric conductivities.

5. The method according to claim 1, wherein the polymer layer is compressed by means of a stamp presenting a variable depression height, resulting in an electrically conductive area having an electric conductivity gradient.

6. The method according to claim 5, wherein the depression height of the stamp varies in continuous manner.

7. A method for producing an electrically conductive area in a polymer material, comprising:
    providing a polymer layer comprising electrically conductive particles with a density such that the layer is insulating,
    heating the polymer material to a temperature higher than or equal to a glass transition temperature of the polymer material,
    compressing a portion of the polymer layer by means of a stamp, in order to obtain a density of conductive particles such that the portion becomes conductive, and
    removing the stamp from the polymer layer,
    wherein the polymer layer is compressed by means of two stamps having different depression heights, resulting in two electrically conductive areas having different electric conductivities.

8. The method according to claim 7, wherein the portion of the polymer layer is compressed during a time comprised between 1 min and 60 min.

9. The method according to claim 7, wherein the portion of the polymer layer is compressed with a pressure comprised between 1 MPa and 3 MPa.

10. A method for producing an electrically conductive area in a polymer material, comprising:
    providing a polymer layer comprising electrically conductive particles with a density such that the layer is insulating,
    heating the polymer material to a temperature higher than or equal to a glass transition temperature of the polymer material,
    compressing a portion of the polymer layer by means of a stamp, in order to obtain a density of conductive particles such that the portion becomes conductive, and
    removing the stamp from the polymer layer, wherein the polymer layer is compressed by means of a stamp presenting a variable depression height, resulting in an electrically conductive area having an electric conductivity gradient.

11. The method according to claim 10, wherein the portion of the polymer layer is compressed during a time comprised between 1 min and 60 min.

12. The method according to claim 10, wherein the portion of the polymer layer is compressed with a pressure comprised between 1 MPa and 3 MPa.

13. The method according to claim 10, wherein the depression height of the stamp varies in continuous manner.

\* \* \* \* \*